United States Patent
Defay et al.

(10) Patent No.: US 9,326,423 B2
(45) Date of Patent: Apr. 26, 2016

(54) METHOD FOR LIMITING THE VARIATION IN THE TEMPERATURE OF AN ELECTRICAL COMPONENT

(71) Applicant: Commissariat a l'energie atomique et aux energies alternatives, Paris (FR)

(72) Inventors: Emmanuel Defay, Voreppe (FR); Neil Mathur, Cambridge (GB); Sohini Kar-Narayan, Cambridge (GB); Jordane Soussi, Bordeaux (FR)

(73) Assignee: Commissariat a L'Energie Atomique et Aux Energies Alternatives, Paris (FR)

( * ) Notice: Subject to any disclaimer, the term of this patent is extended or adjusted under 35 U.S.C. 154(b) by 448 days.

(21) Appl. No.: 13/957,717

(22) Filed: Aug. 2, 2013

(65) Prior Publication Data

US 2014/0036449 A1 Feb. 6, 2014

(30) Foreign Application Priority Data

Aug. 3, 2012 (FR) ...................... 12 57586

(51) Int. Cl.
*H05K 7/20* (2006.01)
*H01L 23/34* (2006.01)
*F25B 21/00* (2006.01)

(52) U.S. Cl.
CPC .......... *H05K 7/20336* (2013.01); *H01L 23/345* (2013.01); *F25B 21/00* (2013.01); *H01L 2924/0002* (2013.01)

(58) Field of Classification Search
CPC . H05K 7/20336; F25B 21/00; H01L 27/1255; H01L 23/345; H01L 24/30105; H01L 21/324
See application file for complete search history.

(56) References Cited

U.S. PATENT DOCUMENTS

| | | | |
|---|---|---|---|
| 4,685,081 A * | 8/1987 | Richman | G11C 19/085 257/713 |
| 5,569,950 A | 10/1996 | Lewis et al. | |
| 6,525,934 B1 * | 2/2003 | Nakanishi | G06F 1/203 165/104.33 |
| 6,877,325 B1 | 4/2005 | Lawless | |
| 7,633,752 B2 * | 12/2009 | Prasher | H01L 23/38 361/688 |
| 9,157,669 B2 * | 10/2015 | Kruglick | H01L 37/02 |
| 2006/0137359 A1 * | 6/2006 | Ghoshal | F25B 21/02 62/3.7 |
| 2006/0201161 A1 * | 9/2006 | Hirai | H01L 23/38 62/3.2 |
| 2011/0146308 A1 | 6/2011 | Casasanta | |

OTHER PUBLICATIONS

Es'kov et al. "Simulation of a solid-state cooler with electrocaloric elements"; Physics of Solid State, 51(8):1574-1577 (2009).
Kar-Narayan et al. "Predicted cooling powers for multilayer capacitors based on various electrocaloric and electrode materials"; Applied Physics Letters, 95:242903 (2009).

(Continued)

*Primary Examiner* — Gregory Thompson
(74) *Attorney, Agent, or Firm* — Occhiuti & Rohlicek LLP

(57) ABSTRACT

A method for limiting temperature variation of an electrical component includes detecting a switch from passive to active states and, in response, varying a potential difference between capacitor electrodes from a first value to a second value, the electrodes being mechanically and electrically insulated from each other by a layer of electrocaloric dielectric, and in response to detecting a switch from active to passive states, varying the potential difference between the electrodes from the second to the first value.

13 Claims, 4 Drawing Sheets

(56) References Cited

OTHER PUBLICATIONS

Liu et al. "Huge electrocaloric effect in Langmuir-Blodgett ferroelectric polymer thin films"; New Journal of Physics, 12:023035 (8pp) (2010).

Lu et al. "Organic and inorganic relaxor ferroelectrics with giant electrocaloric effect"; Applied Physics Letters, 97:162904 (2010).

Mischenko et al. "Giant electrocaloric effect in thin film $PbZr_{0.95}Ti_{0.05}O_3$" Science, 311:1270 (2006).

Sinyavsky et al. "The optical ferroelectric ceramic as working body for electrocaloric refrigeration" Ferroelectrics, 90:213-217 (1989).

\* cited by examiner

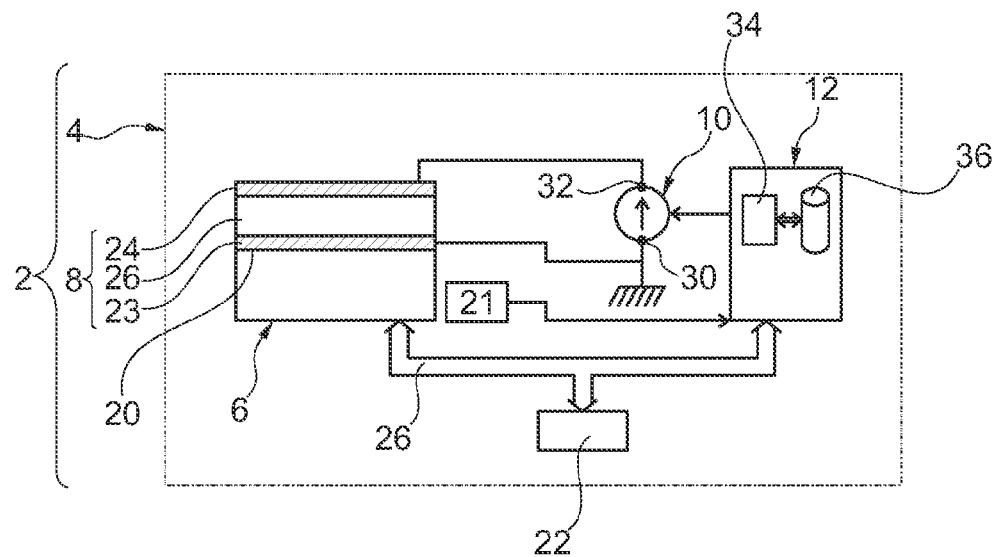
Fig. 1
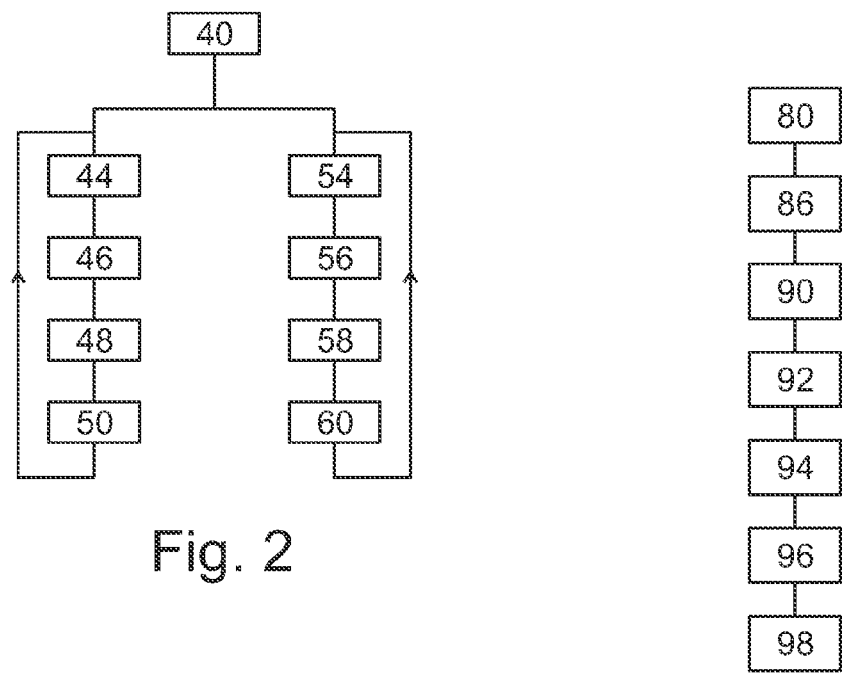
Fig. 2
Fig. 5

METHOD FOR LIMITING THE VARIATION IN THE TEMPERATURE OF AN ELECTRICAL COMPONENT

CROSS-REFERENCE TO RELATED APPLICATIONS

Under 35 USC 119, this application claims the benefit of the priority date of French Patent Application 1257586, filed Aug. 3, 2012, the content of which is herein incorporated by reference.

FIELD OF DISCLOSURE

The invention relates to a method for limiting the variation in the temperature of an electrical component. The invention also relates to a data storage medium and to an electronic system for implementing this method.

BACKGROUND

For each and every electrical component, the manufacturer specifies a nominal operating temperature range and, in particular, a maximum operating temperature $T_{max}$. If the temperature of the component exceeds this temperature $T_{max}$, then the component may be damaged or its performance degraded. It is therefore important to try to keep the temperature of the electrical component below this temperature $T_{max}$.

To do this, it has already been proposed to cool the electrical component using various devices such as a radiator, a coolant, etc.

Recently it has been suggested that it would be possible to use an electrocaloric material to pump heat from a hot spot to a cold spot. However, this implies the use of thermal switches if unidirectional heat flow is to be guaranteed. This is, for example, disclosed in the following article A1: S. Kar-Narayan and N. D. Mathur, "*Predicted cooling powers for multilayer capacitors based on various electrocaloric and electrode materials*", Applied Physics Letters 95, 242903 (2009).

Prior art is also found in U.S. Pat. No. 5,569,950, "Simulation of a solid state cooler with electrocaloric elements", Physics of the solid state, American Institute of Physics, Woodbury, N.Y., US, Vol. 51, Aug. 30, 2009, pages 1574-1577, U.S. Pat. No. 6,877,325 B1, and US Patent Publication 2011/146308 A1.

SUMMARY

The invention aims to provide a simpler method for limiting the variation in the temperature of an electrical component and, especially, to provide a method that does not require the use of thermal switches.

One of its subjects is therefore a method for limiting the variation in the temperature of an electrical component equipped with a heat evacuation face, this method being in accordance with claim 1.

In the case of a positive electrocaloric material, its temperature increases when a potential difference is applied across the electrodes. Therefore, the application of the first potential difference increases the temperature of the electrical component when the latter is in its passive state. However, this increase in the temperature of the electrical component in its passive state is not problematic because in this state the electrical component is far below its maximum temperature $T_{max}$.

Decreasing the potential difference across the capacitor in the active state decreases the temperature of the capacitor, thereby cooling the electrical component when the latter is producing heat. The electrical component is therefore either prevented from reaching its maximum temperature $T_{max}$ or the time taken for it to reach its maximum temperature $T_{max}$ is increased. Thus, controlling the capacitor in the way described in the above method makes it possible to damp and limit the variation in the temperature of the electrical component. Thus, it is possible to prevent the temperature of the component from exceeding the temperature $T_{max}$ without however using thermal switches.

In the case of a negative electrocaloric material, its temperature decreases when a potential difference is applied across the electrodes. The above method also allows the variation in the temperature of an electrical component to be limited using a negative electrocaloric material. However, in this case, the absolute value of the first potential difference is strictly lower than the absolute value of the second potential difference. Embodiments of this method may comprise one or more of the features of the dependent method claims.

These method embodiments moreover have the following advantages:
  passing from the first potential difference to the second potential difference in a time interval the duration of which depends on an estimation of the duration of the active state further smoothes the variation in the temperature of the electrical component;
  in contrast, abruptly passing, i.e. in less than 100 ms, from the first potential difference to the second potential difference either prevents the temperature of the electrical component exceeding $T_{max}$ or at least delays the moment when $T_{max}$ is exceeded.

Another of its subjects is a data storage medium containing instructions for executing the above method, these instructions being executed by a computer.

The invention also relates to an electronic system.

Embodiments of this electronic system may comprise one or more of the features of the dependent system claims.

BRIEF DESCRIPTION OF THE FIGURES

The invention will be better understood on reading the following description, given merely by way of nonlimiting example and with reference to the drawings, in which:

FIG. 1 shows a terminal equipped with an electronic system in which an electrical component is cooled;

FIG. 2 is a flowchart of a method for limiting the variation in the temperature of the electrical component of the system shown in FIG. 1;

FIG. 5 is a flowchart of a process for manufacturing a capacitor for the system shown in FIG. 1;

In these figures, the same references are used to denote the same elements. In the rest of the description, features and functions that are well known in the art will not be described in detail.

DETAILED DESCRIPTION

Figure 3:
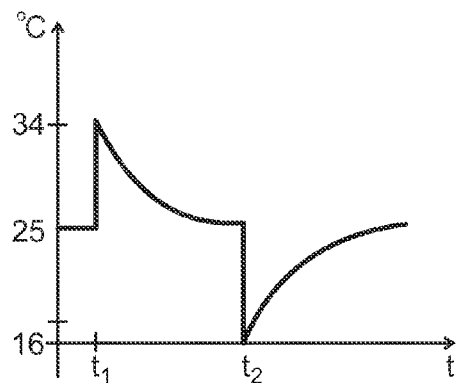
FIG. 3 is a timing diagram illustrating the variation in the temperature of a capacitor of the system shown in FIG. 1 as a function of time.

FIG. 1 shows a terminal 2. For example, the terminal 2 is a mobile terminal such as a mobile phone.

The terminal 2 comprises an electronic system 4 such as a transceiver, a microcontroller, etc.

The system 4 comprises:
an electrical component 6;
a capacitor 8 for cooling the electrical component 6;
a controllable voltage source 10; and
a control unit 12.

Here, the component 6 is an electronic component and, more precisely, an integrated circuit. Typically, this integrated circuit comprises a multitude of controllable electronic switches each of which is able to switch between an off position and an on position in order to perform a preset function. In the off position, current can only pass through the switch with difficulty. In contrast, in the on position current can easily pass through the switch. Each time a switch is switched between its off and on positions some of the electrical power received by the switch is converted into heat. In the on position, some of the power supplied to the switch may also be converted into heat if the switch has a nonzero resistance in this position. Therefore, the component 6 produces heat when it is in use. In contrast, it does not produce heat when it is not in use.

When the component 6 must be cooled, it is said to be in its active state. In contrast, when the component 6 may be heated, it is said to be in its passive state. The switch between these passive and active states is detected on the basis of acquired values of the amount Q of heat produced per second by the component 6 and/or on the basis of acquired values of the temperature T of the component 6. In this first embodiment, the active state is detected once the component 6 produces an amount Q of heat per second greater than a preset threshold $Q_1$, expressed in watts, and its temperature T exceeds a preset threshold $T_1$. In contrast, when the component 6 produces an amount Q of heat per second lower than this threshold $Q_1$, or its temperature T is below the threshold $T_1$, the component is detected to be in its passive state.

Typically, when the component 6 is in its passive state it is not being used or it is being used very little. The expression "used very little" is for example understood to mean that the component 6 is on standby.

The component 6 is controllable and may be switched, in alternation, between its active state and its passive state.

The component 6 here has an associated maximum temperature $T_{max}$. Typically, the temperature $T_{max}$ corresponds to a temperature above which the component 6 risks being damaged or above which its performance degrades. The threshold $T_1$ is strictly below this temperature $T_{max}$.

The threshold value $Q_1$ is here chosen to be strictly above zero and for example to be above 0.1 mW or 1 mW or 10 mW.

The component 6 is designed so that most of the heat that it produces is evacuated via a heat evacuation face 20. Here the face 20 is the upper face of the component 6.

A sensor 21 is provided for measuring the temperature T of the component 6. This sensor 21 is connected to the unit 12.

The component 6 switches between its active and passive states in response to external events acquired via an interface 22. Here, the reception of these events is used to detect when the amount Q of heat produced per second exceeds the threshold $Q_1$. In other words, the reception of these events is used as a physical quantity representative of the amount of heat produced per second by the component 6. More precisely, in this embodiment the reception of an event triggering intense component 6 operation is used to indicate that the amount of heat produced per second by the component 6 exceeds the threshold $Q_1$. In contrast, once an event stopping the intensive operation or placing the component 6 on standby is received over the interface 22, the amount Q is considered to be below the threshold $Q_1$. This manner of proceeding makes it possible to avoid having to use a sensor to detect the amount of heat produced per second.

For example, the interface 22 is a human machine interface or a connection to an information transmission network, etc. The interface 22 is connected to the component 6 via an information transmission bus 26.

Figure 12:
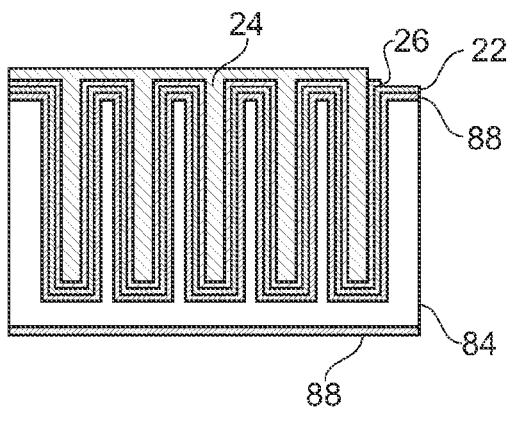
Figure 9:
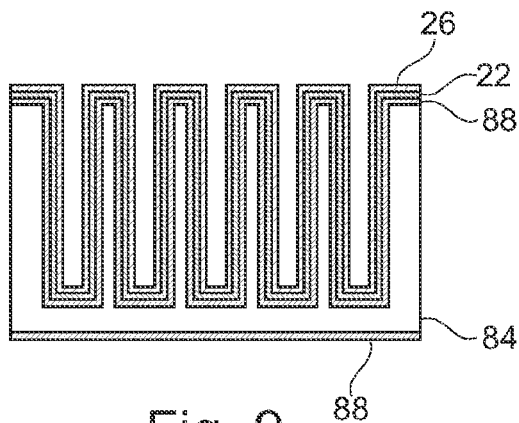

Only a schematic of the structure of the capacitor 8 is shown in FIG. 1. A more detailed embodiment of this structure is shown in FIG. 12.

The capacitor 8 comprises two metallic electrodes 23, 24 mechanically and electrically insulated from each other by a dielectric layer 26. In addition to being made from a good electrical conductor, the electrodes 23 and 24 are also made of a good thermal conductor. In this description, a material is considered to be a good thermal conductor if its thermal conductivity at 22° C. is higher than $2\ W\cdot m^{-1}\cdot K^{-1}$ and, preferably, higher than 10 or $50\ W\cdot m^{-1}\cdot K^{-1}$. The electrodes 23, 24 are for example made of a metal such as platinum, nickel, gold, copper, silver, or palladium. Preferably, these electrodes are made of an oxide-based alloy. For example, the electrodes are preferably made of $RuO_2$, $SiRuO_3$, $IrO_3$ or $LaNiO_3$. Specifically because these electrodes are saturated in oxygen, fatigue and wear of the capacitor is limited.

The electrodes 23 and 24 take the form of two layers of substantially constant thickness $e_e$. Typically the thickness $e_e$ is greater than 10 nm or 0.1 μm and less than 10 μm or 5 μm.

The electrode 23 makes conductive thermal contact with the face 20 in order to cool the component 6. Conductive thermal contact is considered to exist if:

a) the electrode 23 makes direct mechanical and thermal contact with the face 20; or b) the electrode 23 is thermally connected to the face 20 via a good thermal conductor.

Preferably, in case a) or b) above, the cross section over which the heat propagates from the face 20 to the electrode 23 is larger than at least half the area of the face 20 and, preferably, at least equal to the area of the face 20.

In this embodiment, the electrode 23 makes direct mechanical contact with the entire area of the face 20.

To allow the component 6 to be cooled, the layer 26 is made of an electrocaloric dielectric material. An electrocaloric material is a material the temperature of which changes abruptly in response to the application of an electric field.

The behaviour of a positive electrocaloric material in response to an electric field is illustrated in FIG. 3. The temperature of the material is initially equal to the ambient temperature, i.e. 25° C. in the case illustrated in FIG. 3. In the initial state, the electrocaloric material is not subjected to an electric field.

At the time $t_1$ an electric field is applied. This causes an immediate increase ΔT of several degrees in the temperature of this material. In the case illustrated, ΔT is equal to 9° C. Next, the electric field is kept constant between the times $t_1$ and $t_2$. Under these conditions, the temperature of the electrocaloric material decreases via heat exchange with the external environment until its temperature becomes equal to the ambient temperature of the external environment.

At the time $t_2$, the electric field is removed once the temperature of the electrocaloric material has become equal to the ambient temperature. In response, the temperature of the electrocaloric material immediately drops by $-\Delta T$. Next, the temperature of the electrocaloric material increases via heat exchange with the external environment until it once more equals the ambient temperature. Thus the material returns to its initial state. As the graph in FIG. 3 illustrates, an electrocaloric material can therefore be used to temporarily heat or cool an electrical component.

Here, the electrocaloric material the operation of which has just been described is a "positive" electrocaloric material, i.e. its temperature increases when an electric field is applied. Negative electrocaloric materials also exist; the temperature of these materials decreases when an electric field is applied. In this embodiment, the layer 26 is made of a positive electrocaloric material.

Electrocaloric materials have been well known for a long time. However, it has only recently been discovered that the performance obtained from these electrocaloric materials can be considerably improved if thin films of these materials are used. Here, a layer of material is considered to be a thin film if it is less than 500 µm or 50 µm in thickness, and preferably less than 15 µm or 10 µm or 5 µm in thickness. The reader may refer on this subject to the following article A2: A. F. Mischenko, Q. Zhang, J. F. Scott, R. W. Whatmore, N. D. Mathur, "*Giant electrocaloric effect in thin-film PbZr$_{0.95}$Ti$_{0.05}$O$_3$*", 3 Mar. 2006, Volume 311, Science.

Even more recently, it has been demonstrated that it is possible to obtain temperature variations $\Delta T$ of about 40° C. in certain electrocaloric materials. The reader may refer on this subject to the following article A3: S. G. Lu, B. R. Rozic, Q. M. Zhang, Z. Kutnjak, Xinyu Li, E. Furman, Lee J. Gorny et al. "*Organic and inorganic relaxor ferroelectrics with giant electrocaloric effect*", Applied Physics Letters 97, 162904 (2010).

In this description, the layer 26 will be considered to be made of an electrocaloric material if its maximum temperature variation $\Delta T_{max}$ in response to an electric field is at least 5° C. and, preferably, at least 10° C.

The temperature variation $\Delta T_{max}$ occurs near a temperature called here the "transition temperature". This transition temperature is different for each electrocaloric material. The transition temperature of each electrocaloric material is known. For example reference may be made on this subject to Table 1 in article A3 for a number of example transition temperature values.

Here, the material of the layer 26 is chosen to have a transition temperature equal to a temperature $T_a$ to within plus or minus 5 or 2.5 or one times the variation $\Delta T_{max}$ for this material. The temperature $T_a$ is the temperature around which it is desired to stabilise the temperature of the component 6. The temperature $T_a$ often corresponds to the ambient temperature of the external environment. Here, this temperature $T_a$ is therefore taken to be equal to 25° C. By way of illustration only, this could lead to the electrocaloric material [Pb(Mg$_{1/3}$Nb$_{2/3}$)O$_3$]$_{0.93}$—[PbTiO$_3$]$_{0.07}$ being chosen. This material is, for example, described in greater detail in the following article A4: T. M. Correia, J. S. Young, R. W. Whatmore, J. F. Scott, N. D. Mathur and Q. Zhang, Applied Physics Letters 95, 182904 (2009).

However, for other values of the temperature $T_a$, other choices for the electrocaloric material are possible. Typically, the electrocaloric material of the layer 26 is chosen from the group comprising or composed of:

Pb(Zr,Ti)O$_3$ known by the acronym PZT,
(Pb,La)(Zr,Ti)O$_3$ known by the acronym PLZT,
Pb(Mg,Nb,Ti)O$_3$ known by the acronym PMN-PT,
(Ba,Sr)TiO$_3$ known by the acronym BST,
SrBi$_2$Ta$_2$O$_9$ known by the acronym SBT,
PVDF (polyvinylidene fluoride) copolymers such as P(VDF-TrFE) or P(VDF-TrFE-CFE).

In order for the electrocaloric material to have both a large capacity to absorb heat and a thin film structure, it has been suggested to arrange the electrodes 23 and 24 and the layer 26 to form a multilayer capacitor (MLC). The reader may refer on this subject to article A1.

Here the capacitor 8 is a multilayer capacitor the layer 26 of which is less than 5 or 2 µm in thickness. The layer 26 is, for example, between 10 nm and 10 µm in thickness and preferably between 10 nm and 2 µm in thickness or between 100 nm and 2 µm in thickness.

The electrodes 23 and 24 are electrically connected to respective terminals 30, 32 of the voltage source 10. Under these conditions, the source 10 allows a potential difference to be applied across the electrodes 23 and 24 in order to generate the electric field that makes the temperature of the layer 26 change. Here, the terminal 30 is grounded. The potential difference generated by the source 10 is therefore equal to the voltage $V_0$ generated between the terminal 32 and ground.

The source 10 can be controlled by the unit 12 in order to vary the potential difference applied across the electrodes 23 and 24 between two extreme values, denoted DDP1 and DDP2, respectively. Here the value DDP1 is strictly positive and the value DDP2 is equal to 0 V. The value DDP1 is for example higher than 4 V DC.

The unit 12 is programmed to execute the method in FIG. 2. For this purpose, it comprises a programmable computer 34 able to execute instructions stored on a data storage medium. It therefore comprises a memory 36 connected to the computer 34 and containing the instructions required to execute the method of FIG. 2.

In addition, the unit 12 is connected to the source 10 in order to control the value of the voltage $V_0$. It is also connected to the bus 26 in order to acquire events that make it possible to detect when the component 6 switches from its active state to its passive state and vice versa.

The operation of the system 4 will now be described using the method of FIG. 2. Initially, in a step 40, the unit 12 acquires two estimations ED$_{on}$ and ED$_{off}$. The estimations ED$_{on}$ and ED$_{off}$ are estimations of the duration of the time intervals ID$_{on}$ and ID$_{off}$, respectively. The interval ID$_{on}$ is the time interval during which the component 6 is continuously in its active state. The interval ID$_{off}$ is the time interval during which the component 6 is continuously in its passive state. These estimations ED$_{on}$ and ED$_{off}$ are constructed on the basis of prior measurements of the duration of the intervals ID$_{on}$ and ID$_{off}$.

Next, in a step 44, the component 6 receives an activation event at a time $t_{on}$. This event is received by way of the interface 22 and the bus 26.

In a step 46, in immediate response, the component 6 passes into an intensive operating mode. Next, it remains in this intensive operating mode throughout the time interval ID$_{on}$. Typically, this time interval lasts more than 1 ms and, generally, more than 100 ms or 1 s. Its duration is in contrast generally less than one hour or 5 minutes.

Next, in a step 48, the component 6 receives a deactivation event at a time $t_{off}$. This event is received by way of interface 22 and the bus 26.

In a step 50, in immediate response, the component 6 goes into standby. Next, it remains on standby throughout the interval $ID_{off}$. The duration of the interval $ID_{off}$ is generally greater than or equal to the duration of the interval $ID_{on}$. In standby, there is enough heat exchange with the external environment to decrease its temperature until it stabilises around ambient temperature.

After step 50, the method returns to step 44. Thus, since activation and deactivation events are received in alternation, the component 6 regularly alternates between an intensive operating mode and standby.

In parallel, in a step 54, at the time $t_{on}$, the unit 12 detects the switch to the active state. To do this, here, it detects reception of the activation event and acquires the temperature measured by the sensor 21. Reception of the activation event is interpreted as meaning that the amount Q of heat produced per second by the component 6 exceeds the threshold $Q_1$. If the temperature is below the threshold $T_1$, the switch to the active state is not detected. In this case, the unit 12 acquires, at regular intervals, the temperature T in order to detect if the component 6 subsequently switches to its active state. If the temperature T acquired exceeds the threshold $T_1$, the active state of the component 6 is detected. In response to this detection, the unit 12 controls the source 10 in order to decrease the potential difference across the electrodes 23 and 24. This decrease in the potential difference causes a decrease in the temperature of the electrocaloric material, which temperature decrease is transmitted, via thermal conduction, to the electrical component 6. This temperature decrease limits or cancels out the increase in the temperature of the component 6 when the latter is in its active state.

In this embodiment, the unit 12 progressively decreases the potential difference, the decrease being a monotonic function that decreases continuously throughout the time interval $\Delta T_{on}$. Here the duration of the interval $\Delta T_{on}$ is set depending on the estimation $ED_{on}$. For example, in this particular case, the duration of the interval $\Delta T_{on}$ is set equal to the value of the estimation $ED_{on}$.

It is not necessary for the potential difference to decrease linearly over the entire duration of the interval $\Delta T_{on}$ from the value DDP1 to the value DDP2. For example, here, the potential difference decreases more rapidly during the first third of the interval $\Delta T_{on}$ than during the last third of the interval $\Delta T_{on}$. Such a potential difference control strategy allows an abrupt drop in the temperature of the component 6 immediately after it passes into its active state to be avoided.

The ability of the capacitor to absorb heat and therefore to significantly decrease the temperature of the component 6 is illustrated by the following numerical example. The maximum amount of heat that can be absorbed by the capacitor 8 is given by the following relationship: $\Delta Q_{max}=mC\Delta T$, where:

C is the specific heat capacity of the layer 26;

m is the mass of the layer 26; and $\Delta T$ is the variation in the temperature of the layer 26 in response to the application of a potential difference across the electrodes 23 and 24 equal to DDP1-DDP2.

For example, C is equal to 350 $J \cdot K^{-1} \cdot kg^{-1}$. The density of the material of the layer 26 is equal to 7000 $kg/m^3$. The total volume of the layer 26 is equal to 1 $mm^3$ and the temperature variation $\Delta T$ is equal to 10° C. Therefore, the maximum amount of heat that can be absorbed by the layer 26 is 25 mJ. If the duration of the interval $ID_{on}$ is assumed to be one second and the area of the face 20 is 1 $mm^2$, the capacitor 8 can absorb a power density of 2.5 $W/cm^2$ during this second. In other words, this means that if the component 6 produces 2.5 $W/cm^2$ for one second, its temperature will remain constant if the capacitor 8 is activated. If the component 6 is made of silicon and its volume is 1 $mm^3$, if the capacitor 8 is not activated its temperature will increase by 7.5° C. If the capacitor 8 is activated while the component 6 produces 25 mJ of heat over one second, the temperature of the component 6 will not increase.

Next, in a step 56, when the potential difference across the electrodes 23 and 24 reaches the value DDP2, the unit 12 keeps the potential difference equal to this value DDP2 as long as the component 6 has not been detected to switch to its passive state.

Next, in a step 58, the unit 12 detects when the component 6 switches from its active state to its passive state. As in step 54, to do this, the unit 12 detects reception of the deactivation event of the component 6 at the time $t_{off}$. At the same time, the unit 12 acquires the value measured by the sensor 21. Provided the measured value of the temperature T is above the threshold $T_1$, the switch to the passive state is not detected.

In contrast, once the measured value of the temperature T drops below the threshold $T_1$, the switch to the passive state is detected. In response, the unit 12 controls the source 10 in order to once more increase the potential difference across the electrodes 23 and 24. This increase causes the temperature of the layer 26 to increase and, by thermal conduction, limits the decrease in the temperature of the component 6. In this embodiment, the unit 12 gradually increases the potential difference from the value DDP2 to the value DDP1, the increase being a monotonic function that increases throughout the time interval $\Delta T_{off}$. Here the duration of the interval $\Delta T_{off}$ is set depending on the estimation $ED_{off}$. For example, in this embodiment, the duration of the interval $\Delta T_{off}$ is set equal to the value of the estimation $ED_{off}$. By way of illustration, the potential difference increases linearly from the value DDP2 to the value DDP1 over the entire duration of the interval $\Delta T_{off}$.

In a step 60, when the potential difference once more reaches the value DDP1, the unit 12 maintains the potential difference at this value provided the component 6 is still in its passive state. Step 54 is then returned to.

Figure 4:
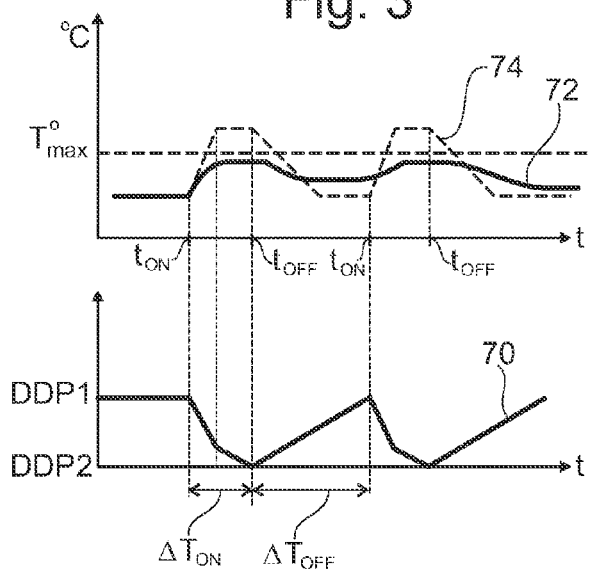
FIG. 4 shows two timing diagrams respectively illustrating the variation in the temperature of the electrical component of the system shown in FIG. 1 over time, and the variation over time in a potential difference across the terminals of a capacitor of the system shown in FIG. 1.
Figure 6:
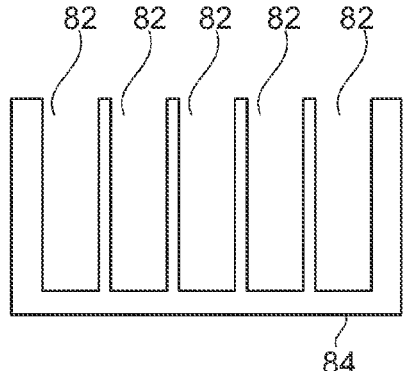
FIGS. 6 to 12 are schematic illustrations of vertical cross sections showing various steps in a process for manufacturing the capacitor of the system shown in FIG. 1

FIG. 4 shows two timing diagrams, one above the other. In the bottom timing diagram, the line 70 represents the variation over time of the value of the potential difference across the electrodes 23 and 24 when the method shown in FIG. 2 is implemented. The line 70 is drawn for the particular case where the value DDP2 is reached at the time $t_{off}$ and the value DDP1 is reached at the time $t_{on}$. In this particular case, steps 56 and 60 are omitted.

In the top timing diagram, the solid line 72 shows the variation in the temperature of the component 6 when the method shown in FIG. 2 is implemented. The dotted line 74 represents the temperature of the component 6 in the case where the method in FIG. 2 is not implemented. As the line 74 shows, if the method in FIG. 2 is not implemented, the temperature of the component 6 exceeds the temperature $T_{max}$. In contrast, if the method in FIG. 2 is implemented, the temperature of the component 6 does not exceed the temperature $T_{max}$.

It will also be noted that the average value of the temperature of the component 6 over a number of successive intervals $ID_{on}$ and $ID_{off}$ is the same whether the method in FIG. 2 is implemented or not. Thus, the method in FIG. 2 allows the variation in the temperature of the component 6 to be limited but does not allow its average temperature over a long period of time to be decreased.

FIG. 5 shows a particular process for manufacturing the capacitor 8. This process especially allows the thickness of the layer 26 to be decreased so that the latter lies between 10 nm and 2 µm. Specifically, decreasing the thickness of the layer 26 allows the value DDP1 to be applied across the electrodes 23 and 24 to be decreased, thereby simplifying production of the system 4. In addition, this process allows the capacitor 8 to be produced on the same substrate as the component 6. This process will now also be described with reference to FIGS. 6 to 12.

In a step 80, trenches 82 (FIG. 6) are etched in a substrate 84. For example, the substrate 84 is a flat silicon substrate. The trenches are typically between 0.5 and 30 μm in width and preferably less than 5 or 2 μm in width. Here, the trenches are equal to 1 μm in width. The trenches 82 may have any cross section. For example they may be circular or rectangular.

The trenches are typically between 1 μm and 500 μm in depth, and preferably between 50 μm and 100 μm in depth. Here, they are equal to 100 μm in depth.

The trenches 82 are etched by a deep etching process using an anisotropic technique. For example, it may employ, in alternation, steps of etching with $SF_6$ and of passivating the vertical sidewalls with $C_4F_8$. This process is called the Bosch process.

Next, in a step 86, a barrier layer 88 (FIG. 7) is produced to prevent undesired diffusion of chemical species into the substrate 84. For example, the barrier layer 88 is produced by thermal oxidation of the substrate. This barrier layer 88 is typically between 10 nm and 5 μm in thickness, and preferably between 50 nm and 150 nm in thickness. Here it is equal to 100 nm in thickness.

In a step 90, the electrode 23 (FIG. 8) is deposited. This electrode is for example deposited using a chemical vapour deposition (CVD) or atomic layer deposition (ALD) technique. Here, the electrode 23 is between 10 nm and 5 μm in thickness. In this case, it is equal to 100 nm in thickness.

In a step 92, the layer 26 (FIG. 9) is deposited. The method used to deposit the layer 26 depends on the electrocaloric material chosen. For example, the deposition method may be a metal organic chemical vapour deposition (MOCVD) or atomic layer deposition (ALD) method. The deposition may also be carried out using a sol-gel technique followed by an activation anneal. Typically, the anneal temperature is 140° for PVDF copolymers and 700° C. for the perovskites. Here, the layer 26 is between 10 nm and 5 μm in thickness.

Figure 10:
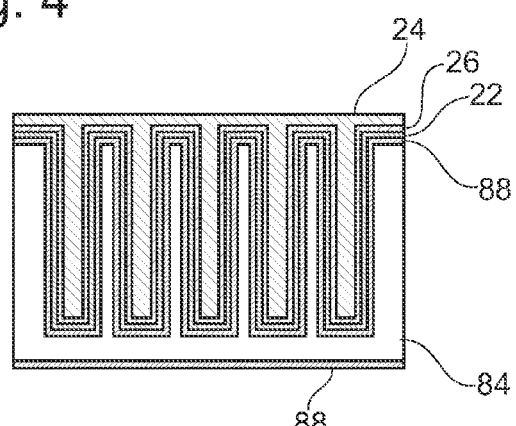
Figure 7:
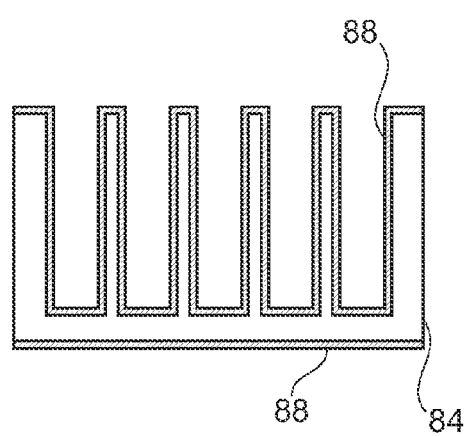

Next, in a step 94, the electrode 24 is deposited (FIG. 10). The electrode 24 is typically deposited using the same methods as those described for step 90.

Figure 11:
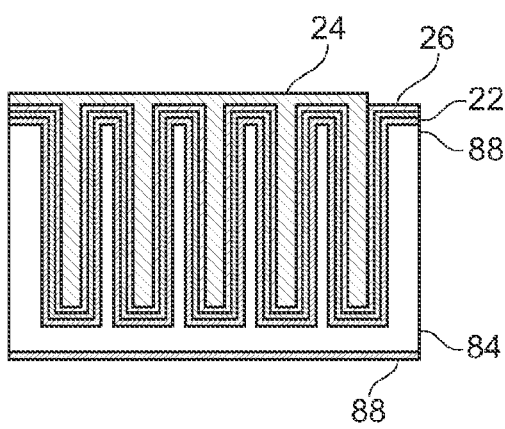
Figure 8:
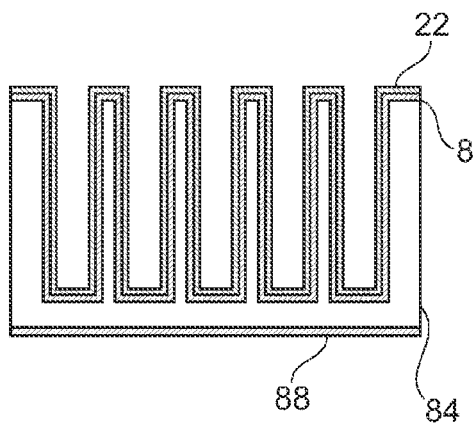

In a step 96, part of the electrode 24 is etched in order to expose the layer 26 (FIG. 11). For example, this etch may be obtained by dry etching with $CHF_3/O_2$ or $SF_6$ or by ion milling or by wet chemical etching.

Lastly, in a step 98, part of the layer 26 is etched in order to expose the electrode 23. As above, this partial etch may be obtained by dry etching or by ion milling or by wet chemical etching. It is then possible to apply a potential difference across the electrodes 23 and 24. Optionally, after step 98, the capacitance of the capacitor 8 thus produced is tested.

Figure 13:
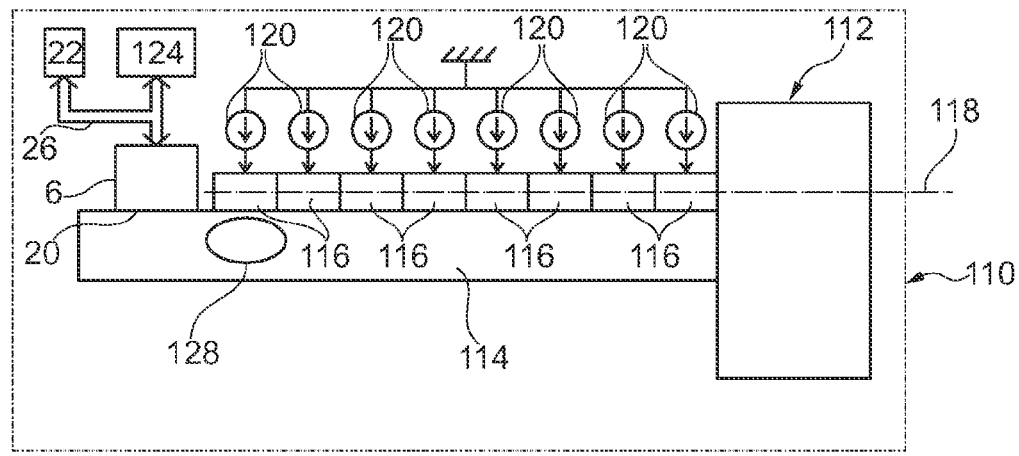
FIG. 13 is a schematic illustration of another embodiment of an electronic system in which an electrical component is cooled.

FIG. 13 shows an electronic system 110 identical to the system 4 except that the capacitors are used to accelerate heat transfer from the component 6 to a heat sink 112. For example, the sink 112 is a radiator that exchanges heat, by convection, with an external medium. The sink 112 is thermally connected to the face 20 of the component 6 by a heat pipe 114. At one end, the pipe 114 makes direct mechanical and thermal contact with the face 20. At the other end, it makes direct mechanical and thermal contact with the sink 112. For example, in this embodiment, the pipe 114 is formed by the silicon substrate in which the component 6 was produced.

N capacitors 116 are placed between the component 6 and the sink 112, said capacitors being aligned with one another along a straight line 118 passing through the component 6 and the sink 112. To simplify FIG. 13, only eight capacitors 116 have been shown. However, N is any integer greater than or equal to two and is preferably greater than or equal to 8, 16 or 32 or 100. Preferably, the number of capacitors 116 aligned along the straight line 118 is greater than 100 or 1000 capacitors 116 per centimeter in density.

Here, all the capacitors 116 are identical to the capacitors 8. The electrode 23 of each of these capacitors 116 makes direct mechanical and thermal contact with the heat pipe 114. This electrode 23 is grounded. To simplify FIG. 13, the ground connection has not been shown.

A voltage source 120 is associated with each capacitor 116 in order to make it possible to apply a controllable potential difference across its electrodes 23 and 24. Each source 120 is for example identical to the source 10.

The control unit 112 is replaced by a control unit 124 for controlling the various voltage sources 120. The unit 124 is identical to the unit 12 but programmed to execute the method in FIG. 14. To simplify the figure, the connections between the unit 124 and each of the sources 120 have not been shown.

Figure 14:
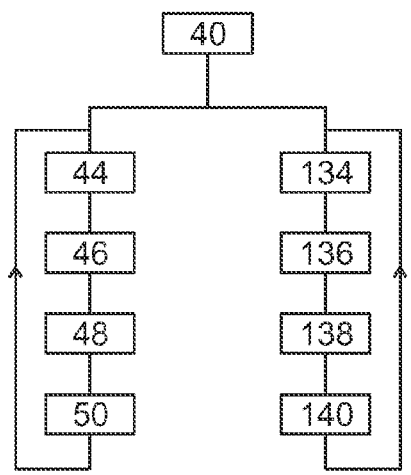
FIG. 14 is a flowchart of a method for cooling the electrical component shown in FIG. 13.

The operation of the system 110 will now be described with reference to the method in FIG. 14. The method in FIG. 14 is identical to the method in FIG. 2 except that steps 54 to 60 have been replaced with steps 134 to 140, respectively.

Step 134 is identical to step 54 except that the sources 120 are controlled one after the other starting with the source 120 connected to the capacitor 116 closest to the component 6 and ending with the source 120 connected to the capacitor 116 furthest from the component 6. Here, the control signal sent to a source 120 in order to decrease the potential difference across the electrodes 23 and 24 of the capacitor to which said source is connected is a signal that makes the potential difference drop abruptly from its value DDP1 to its value DDP2. The term "abruptly" is understood to mean that the potential difference changes between the values DDP1 and DDP2 in less than 100 ms or in less than 1 ms.

The time interval ΔC between the point in time when control of a source 120 is initiated and the point in time when control of a source 120 connected to the immediately consecutive capacitor 116 along the line 118 is initiated is chosen to be longer than one hundredth of the duration of the interval $ID_{on}$ or of the estimation $ED_{on}$. Preferably, the duration of the interval ΔC is smaller than 100 times the duration of the interval $ID_{on}$ or of the estimation $ED_{on}$.

When the potential difference across the electrodes 23 and 24 of a capacitor 116 is decreased, the latter cools the pipe 114 in the region located immediately under its electrode 23. The cooled region creates a cold spot 128 represented by an ellipse in FIG. 13. The cold spot 128 attracts heat dissipated by the component 6. Next, when the following source 120 is controlled, the cold spot moves towards the sink 112. The heat dissipated by the component 6 then moves towards the new position of the cold spot 128. By controlling the sources 120 in succession, as described here, the cold spot 128 moves from the component 6 to the sink 112. This accelerates the transfer of heat from the component 6 to the sink 112.

In step 136, when the potential difference across the electrodes 23 and 24 of a capacitor 116 reaches the value DDP2, the unit 24 controls the source 120 connected to this capacitor in order to maintain this potential difference provided that no deactivation event is received for the component 6.

The step 138 consists in carrying out step 58 at the same time for each of the capacitors 116. However, here, by way of illustration, the control signal from the source 120 makes the potential difference pass abruptly from the value DDP2 to the value DDP1.

In step 140, when the potential difference across the electrodes 23 and 24 of a capacitor 116 reaches the value DDP1, the unit 24 controls the source 120 connected to this capacitor in order to maintain this potential difference as long as the component 6 has not been detected to switch to its active state.

The method then returns to step 134.

Many other embodiments are possible. For example, other electrocaloric materials than those described above may be suitable. Thus, the positive electrocaloric material may be replaced by a negative electrocaloric material, i.e. an electrocaloric material the temperature of which decreases when a potential difference is applied to the material between the electrodes. In this case, when the component is in its passive state, no potential difference is applied to the capacitor. When the component switches from its passive state to its active state, a potential difference is applied in order to decrease the temperature of the component. In other words the values DDP1 and DDP2 are reversed in the case of a negative electrocaloric material. Thus, everything described for the particular case of a positive electrocaloric material may be transposed to the case of a negative electrocaloric material.

The monotonic function used to vary the potential difference across the electrodes 23 and 24 may be a linear function or be replaced by a non-linear function. For example, a 2nd- or higher-order polynomial function could be used.

The duration of the interval $\Delta T_{on}$ or $\Delta T_{off}$ may not be directly proportional to the estimations $ED_{on}$ and $ED_{off}$. For example, the duration of the interval $\Delta T_{on}$ may be related to the estimation $ED_{on}$ by a non-linear relationship.

The estimation $ED_{on}$ is not necessarily a pre-recorded constant. For example, the value of the estimation $ED_{on}$ may be reset each time a log of previously observed interval $ID_{on}$ durations is updated. The estimation $ED_{on}$ may also be reset during the interval $ID_{on}$ so that the duration $\Delta T_{on}$ is itself reset during the interval $ID_{on}$. These various variants of the monotonic function used during the interval $ID_{on}$ may also be transposed to the monotonic function used during the interval $ID_{off}$ by replacing $\Delta T_{on}$ with $\Delta T_{off}$, $ED_{on}$ by $ED_{off}$ and by changing the sign of the gradient of the monotonic function.

Other methods of detecting the passage from the active state to the passive state and vice versa may be used. For example, as a variant, only the measured temperature of the component 6 is used. For example, in step 54, the passage from the passive state to the active state may be detected when the measured temperature exceeds the threshold $T_1$. Similarly, in step 58, passage from the active state to the passive state may be detected when the measured temperature drops below the threshold $T_1$. Conversely, it would also be possible to use only the amount Q of heat produced per second to detect the switch between the passive and active states.

Other ways of acquiring the amount Q of heat produced per second are possible. For example, a sensor may be used to detect the amount of heat produced per second by the component 6.

Preset thresholds $S_2$ different from the preset thresholds $S_1$ may be used to detect the switch from the active state to the passive state, the thresholds $S_1$ being used to detect the switch from the passive state to the active state. Preferably, the thresholds $S_1$ are strictly higher than the thresholds $S_2$. However, the thresholds $S_1$ and $S_2$ may also be equal, as described above in the particular case where the thresholds $S_1$ and $S_2$ each corresponded to the thresholds $Q_1$, $T_1$. As a variant, the value of the potential difference applied during the intervals $\Delta T_{on}$ and $\Delta T_{off}$, respectively, may also depend on the measured temperature. For example, the higher the measured temperature, the more rapidly the potential difference between the electrodes 23 and 24 is varied.

Other embodiments of the capacitor 8 are possible. For example, such a capacitor may also be produced in the way described in article A1. In this article, the capacitor is produced using a conventional multilayer capacitor manufacturing process. The capacitor 8 may also be produced in the same way as film capacitors by rolling up a multilayer film produced by superposing a metallic layer, the dielectric layer and another metallic layer. The metallic layers correspond to the electrodes. In this case, the dielectric layer is often more than 2 μm or 5 μm in thickness and preferably is less than 20 μm or 15 μm in thickness.

The electrode 23 of the capacitor 8 does not necessarily make direct contact with the face 20. For example, the electrode 23 may make thermal contact with the face 20 via one or more good thermal conductors.

As a variant, the various capacitors 116 are not all identical. For example, a thermal property of the capacitors 116, such as their specific heat capacity, their volume, the nature of the electrocaloric material, etc. may differ from one capacitor to another. In another variant, not all the monotonic functions used to vary the potential difference between the values DDP1 and DDP2 are the same from one capacitor to another.

The component 6 is not necessarily an integrated circuit. For example, the component 6 may be a passive electronic component such as a resistor, a capacitor or an inductor. The component 6 may also be a more complex electrical component such as a transformer.

The terminal 2 is not necessarily a mobile terminal.

The above description applies to the case where the temperature $T_a$ is very different from 25° C. For example, in another application, the temperature $T_a$ exceeds 100° C. or, in contrast, is negative.

The invention claimed is:

1. A method for limiting temperature variation of an electrical component comprising a heat evacuation face, said method comprising acquiring one or more values of one or more physical quantities, said one or more values being representative of one of a temperature of said electrical component and a physical quantity representative of a rate at which heat is produced by said electrical component, detecting, based at least in part on said one or more values of said physical quantities thus acquired, when said electrical component switches between an active state, in which said electrical component must be cooled, and a passive state, in which said electrical component may be heated, in response to detection of said electrical component as having switched from said passive state to said active state, causing a voltage source to vary a potential difference between first and second electrodes of a capacitor from a first value to a second value, and if said second value is reached before a next time said electrical component is detected as having switched from said active state to said passive state, causing said voltage source to maintain said second value provided said electrical component remains in said active state, said electrodes being mechanically and electrically insulated from each other by a layer of electrocaloric dielectric material, said first electrode making conductive thermal contact with said heat evacuation face of said electrical component, and said first and second values being such that variation in potential difference causes heat to be absorbed by said layer of electrocaloric dielectric material, and in response to detection of said electrical component as having switched from said active state to said passive state, causing said voltage source to vary said potential difference between said first and second electrodes of said capacitor from said second value to said first value and, if said first value is reached before a next time said electrical component is detected as having switched from said passive state to said active state, to maintain said first value provided said electrical component remains in said passive state.

2. The method of claim 1, further comprising acquiring an estimate of a duration of a next active state, controlling said voltage source so that, within a given time interval, said potential difference passes monotonically from said first value to said second value, and adjusting a duration of said given time interval based at least in part on said estimate.

3. The method of claim 1, further comprising detecting a switch from said passive state to said active state by comparing said acquired value with a first preset threshold, and detecting a switch from said active state to said passive state by comparing said acquired value with a second preset threshold.

4. The method of claim 3, wherein said first and second preset thresholds are different.

5. The method of claim 1, wherein said electrocaloric material is a positive electrocaloric material and wherein an absolute value of said first potential difference value is greater than an absolute value of said second potential difference value.

6. The method of claim 1, wherein said electrocaloric material is a negative electrocaloric material and wherein an absolute value of said first potential difference value is less than an absolute value of said second potential difference value.

7. The method of claim 1, wherein, in said passive state, said temperature of said electrical component drops below a maximum operating temperature specified for said electrical component without using said capacitor.

8. A manufacture comprising a non-transitory data storage medium having encoded thereon instructions for causing a computer to execute the method of claim 1.

9. An apparatus comprising an electronic system, said electronic system comprising an electrical component comprising a heat evacuation face, said electrical component being configured to switch, in response to a control signal, between an active state, in which said electrical component must be cooled, and a passive state in which said electrical component may be heated, a first capacitor comprising first and second electrodes and a layer made of a dielectric material mechanically and electrically insulating said first and second electrodes from each other, said first electrode making conductive thermal contact with said heat evacuation face of said electrical component, a first voltage source configured to apply a controllable potential difference between said first and second electrodes of said first capacitor, and a control unit for controlling said first voltage source in order to limit temperature variation of said electrical component, wherein said dielectric material comprises an electrocaloric material, and wherein said control unit is programmed to acquire one or more values of one or more physical quantities representative of one of said temperature of said electrical component and a physical quantity representative of an amount of heat produced per second by said electrical component, to detect, based on said one or more values of said physical quantities acquired, a switch of said electrical component switches between an active and a passive state, in response to detecting a switch from said passive state to said active state, to cause said first voltage source to vary said potential difference between said first and second electrodes of said capacitor from a first value to a second value and, if said second value is reached before a next time said electrical component is detected as having switched from said active state to said passive state, to maintain said second value provided said electrical component is in said active state, and in response to detection of a switch from said active state to said passive state, to control said voltage source to vary said controllable potential difference between said first and second electrodes of said capacitor from said second value to said first value, and if said first value is reached before a next time said electrical component is detected as having switched from said passive state to said active state, to maintain said first value provided said electrical component is in said passive state.

10. The apparatus of claim 9, further comprising a heat sink, a heat pipe making direct thermal and mechanical contact, at a first end thereof, with said heat evacuation face of said electrical component and, at a second end thereof, with said heat sink, a second capacitor comprising first and second electrodes and an electrocaloric dielectric layer mechanically and electrically insulating said first and second electrodes from each other, said first electrodes of said first and second capacitors being in direct thermal and mechanical contact with said heat pipe, said first electrode of said second capacitor being between said first electrode of said first capacitor and said heat sink, and a second voltage source configured to apply a controllable potential difference between said two electrodes of said second capacitor, wherein said control unit is programmed to control said second voltage source so that said heat pipe is cooled with said second capacitor when said electrical component is detected as having switched from said passive state to said active state but with a delay of at least 10 milliseconds relative to a point in time at which said control unit controls said first voltage source in order to cool said heat pipe with said first capacitor.

11. The apparatus of claim 9, wherein said electrocaloric dielectric layer is less than 50 μm in thickness.

12. The apparatus of claim 11, wherein said electrocaloric dielectric layer is less than 2 μm in thickness.

13. The apparatus of claim 9, wherein said electrical component comprises an integrated circuit comprising at least one electronic switch.

* * * * *